(12) United States Patent
Shakutsui et al.

(10) Patent No.: US 10,991,905 B2
(45) Date of Patent: Apr. 27, 2021

(54) ORGANIC ELECTROLUMINESCENT ELEMENT

(71) Applicant: SUMITOMO CHEMICAL COMPANY, LIMITED, Tokyo (JP)

(72) Inventors: Masato Shakutsui, Niihama (JP); Masaya Shimogawara, Niihama (JP); Shinichi Morishima, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/072,322

(22) PCT Filed: Jan. 24, 2017

(86) PCT No.: PCT/JP2017/002319
§ 371 (c)(1),
(2) Date: Jul. 24, 2018

(87) PCT Pub. No.: WO2017/130955
PCT Pub. Date: Aug. 3, 2017

(65) Prior Publication Data
US 2019/0036072 A1 Jan. 31, 2019

(30) Foreign Application Priority Data

Jan. 26, 2016 (JP) .............................. JP2016-012542

(51) Int. Cl.
*H01L 51/52* (2006.01)
*H05B 33/04* (2006.01)
*H01L 51/50* (2006.01)

(52) U.S. Cl.
CPC .......... *H01L 51/5246* (2013.01); *H01L 51/50* (2013.01); *H01L 51/5012* (2013.01);
(Continued)

(58) Field of Classification Search
CPC ............. H01L 51/5234; H01L 51/5237; H01L 51/5246; H01L 51/5259; H05B 33/04
See application file for complete search history.

(56) References Cited

U.S. PATENT DOCUMENTS 6,963,169 B2 * 11/2005 Peng .................... H01L 27/3283
313/506
2004/0119403 A1 6/2004 McCormick et al.
(Continued)

FOREIGN PATENT DOCUMENTS

CN 1703123 A 11/2005
CN 1726607 A 1/2006
(Continued)

OTHER PUBLICATIONS

International Search Report for PCT/JP2017/002319 dated Apr. 11, 2017.
(Continued)

*Primary Examiner* — Hsien Ming Lee
(74) *Attorney, Agent, or Firm* — Sughrue Mion, PLLC

(57) ABSTRACT

An organic EL element includes a support substrate, an organic EL portion that is disposed on the support substrate and is formed by stacking a first electrode layer, an organic functional layer, and a second electrode layer, a sealing member that seals the organic EL portion, and one or more moisture absorbing portions that have moisture absorption characteristics. The moisture absorbing portion is disposed in an outer edge portion of a light emitting area of the organic EL portion in which the first electrode layer, the organic functional layer, and the second electrode layer are sequentially continuously superimposed when viewed in a stacking direction of the organic EL portion. An area of the moisture absorbing portion disposed on the light emitting area is smaller than an area of the light emitting area.

7 Claims, 3 Drawing Sheets

(52) U.S. Cl.
CPC ...... *H01L 51/5206* (2013.01); *H01L 51/5221* (2013.01); *H01L 51/5259* (2013.01); *H05B 33/04* (2013.01); *H01L 2251/5361* (2013.01)

(56) References Cited

U.S. PATENT DOCUMENTS

| | | |
|---|---|---|
| 2005/0269926 A1 | 12/2005 | Fukuoka et al. |
| 2006/0278965 A1 | 12/2006 | Foust et al. |
| 2009/0108748 A1 | 4/2009 | Toyoda et al. |
| 2010/0102302 A1 | 4/2010 | Kase et al. |
| 2012/0112212 A1* | 5/2012 | Kim .................. H01L 51/5246 257/88 |
| 2013/0048967 A1 | 2/2013 | Nishido et al. |
| 2014/0103324 A1 | 4/2014 | Nakamura et al. |
| 2015/0155522 A1* | 6/2015 | Kim .................. H01L 51/5253 257/40 |
| 2015/0318516 A1 | 11/2015 | Ito et al. |
| 2015/0357600 A1* | 12/2015 | Sonoda ................. H05B 33/04 257/98 |

FOREIGN PATENT DOCUMENTS

| | | |
|---|---|---|
| CN | 101218692 A | 7/2008 |
| CN | 201796893 U | 4/2011 |
| JP | 2006-511916 A | 4/2006 |
| JP | 2008-288034 A | 11/2008 |
| JP | 2009-110872 A | 5/2009 |
| JP | 2010-102994 A | 5/2010 |
| JP | 2011-028896 A | 2/2011 |
| JP | 2013-065546 A | 4/2013 |
| JP | 2016-001665 A | 1/2016 |
| JP | 2016-012433 A | 1/2016 |
| WO | 2013/015383 A1 | 1/2013 |
| WO | 2014/091767 A1 | 6/2014 |

OTHER PUBLICATIONS

International Preliminary Report on Patentability with a Translation of Written Opinion issued from the International Bureau in counterpart International Application No. PCT/JP2017/002319, dated Aug. 9, 2018.
Communication dated May 27, 2019 from China National Intellectual Property Administration issued in a counterpart Chinese Application No. 201780007805.0.
Communication dated Sep. 23, 2019, from the European Patent Office in counterpart European Application No. 17744185.4.
Notice of Reasons for Rejections dated Jan. 12, 2021 from the Japanese Patent Office in JP Application No. 2017-564263.

* cited by examiner

ORGANIC ELECTROLUMINESCENT ELEMENT

CROSS REFERENCE TO RELATED APPLICATIONS

This application is a National Stage of International Application No. PCT/JP2017/002319 filed Jan. 24, 2017, claiming priority based on Japanese Patent Application No. 2016-012542 filed Jan. 26, 2016.

TECHNICAL FIELD

The invention relates to an organic electroluminescent (EL) element.

BACKGROUND ART

For example, a conventional organic EL element described in Patent Literature 1 is known. The organic EL element described in Patent Literature 1 includes an anode (a transparent electrode), a cathode (a display electrode) that is disposed to face the anode, an organic functional layer (a light emitting element layer) that is interposed between the anode and the cathode and spontaneously emits light when different voltages are applied to the anode and the cathode, and a getter member that is stacked to cover the cathode and the organic functional layer.

CITATION LIST

Patent Literature

Patent Literature 1: Japanese Unexamined Patent Application Publication No. 2011-28896

SUMMARY OF INVENTION

Technical Problem

In the getter member, for example, bleed-out of a monomer component or a newly generated component may occur with the elapse of time. When bleed-out occurs and a component thereof infiltrates into a defective portion of the cathode, dark spots (non-emission points) may be generated in the defective portion. In the conventional organic EL element, the cathode and the organic functional layer (a light emitting area) are entirely covered with the getter member. Accordingly, when bleed-out occurs in the getter member, dark spots may be generated in the entire cathode covered with the getter member. Accordingly, in the conventional organic EL element, there is concern that emission characteristics will deteriorate with the elapse of time.

An objective of an aspect of the invention is to provide an organic EL element that can curb deterioration of emission characteristics.

Solution to Problem

An organic EL element according to an aspect of the invention is an organic EL element including: a support substrate; an organic EL portion that is disposed on the support substrate and is formed by stacking a first electrode layer, an organic functional layer, and a second electrode layer; a sealing member that seals the organic EL portion; and one or more moisture absorbing portions that have moisture absorption characteristics, wherein the moisture absorbing portion is disposed in an outer edge portion of a light emitting area of the organic EL portion in which the first electrode layer, the organic functional layer, and the second electrode layer are sequentially continuously superimposed when viewed in a stacking direction of the organic EL portion, and wherein an area of the moisture absorbing portion disposed on the light emitting area is smaller than an area of the light emitting area.

In the organic EL element according to the aspect of the invention, the moisture absorbing portion is disposed in the outer edge portion of the light emitting area of the organic EL portion. Accordingly, when bleed-out occurs in the moisture absorbing portion, it is possible to prevent a component generated by the bleed-out from affecting the entire second electrode layer. Accordingly, in the organic EL element, it is possible to minimize occurrence of dark spots in the second electrode layer even when bleed-out occurs. Since the moisture absorbing portion is provided, it is possible to curb a decrease of the light emitting area due to infiltration of moisture. As a result, in the organic EL element, it is possible to curb deterioration of emission characteristics.

In one embodiment, the area of the moisture absorbing portion disposed on the light emitting area may occupy 20% or less of the area of the light emitting area. Accordingly, since about 80% of the area of the light emitting area is secured, it is possible to curb deterioration of emission characteristics while maintaining emission characteristics.

In one embodiment, the area of the moisture absorbing portion disposed on the light emitting area may occupy 10% or less of the area of the light emitting area. Accordingly, since about 90% of the area of the light emitting area is secured, it is possible to curb deterioration of emission characteristics while maintaining emission characteristics.

In one embodiment, the moisture absorbing portion may be disposed to cover an end face of the second electrode layer. Accordingly, it is possible to prevent infiltration of moisture into the second electrode layer. As a result, it is possible to curb deterioration of the second electrode layer.

In one embodiment, the moisture absorbing portion may be disposed to cover end faces of the organic functional layer and the second electrode layer. Accordingly, it is possible to prevent infiltration of moisture into the organic functional layer and the second electrode layer. As a result, it is possible to curb deterioration of the organic functional layer and the second electrode layer.

In one embodiment, the first electrode may be an anode, and the second electrode may be a cathode.

In one embodiment, the sealing member may include an adhesive portion that has adhesiveness and covers the organic EL portion and the moisture absorbing portion, and a thickness of the moisture absorbing portion may be equal to or less than ½ of a thickness of the adhesive portion. When the thickness of the moisture absorbing portion is excessively larger than the thickness of the adhesive portion, the moisture absorbing portion cannot be appropriately covered with the adhesive portion. By setting the thickness of the moisture absorbing portion to be equal to or less than ½ of the thickness of the adhesive portion, the moisture absorbing portion can be appropriately covered with the adhesive portion.

Advantageous Effects of Invention

According to the aspect of the invention, it is possible to curb deterioration of emission characteristics.

DESCRIPTION OF EMBODIMENTS

Hereinafter, exemplary embodiments of the invention will be described in detail with reference to the accompanying drawings. In description with reference to the drawings, the same or corresponding elements will be referred to by the same reference signs and description thereof will not be repeated.

Figure 1:
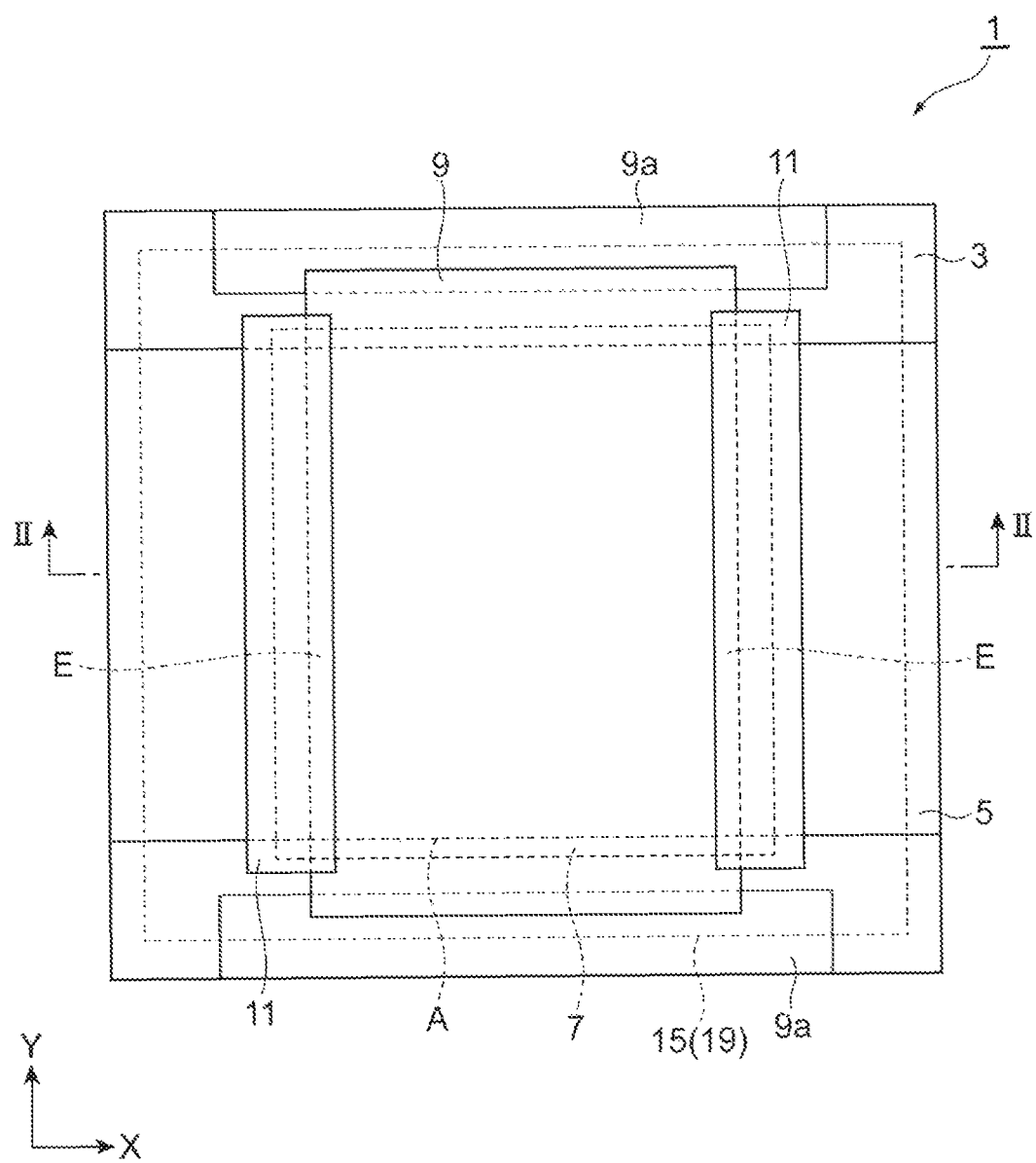
FIG. 1 is a plan view of an organic EL element according to an embodiment.
Figure 2:
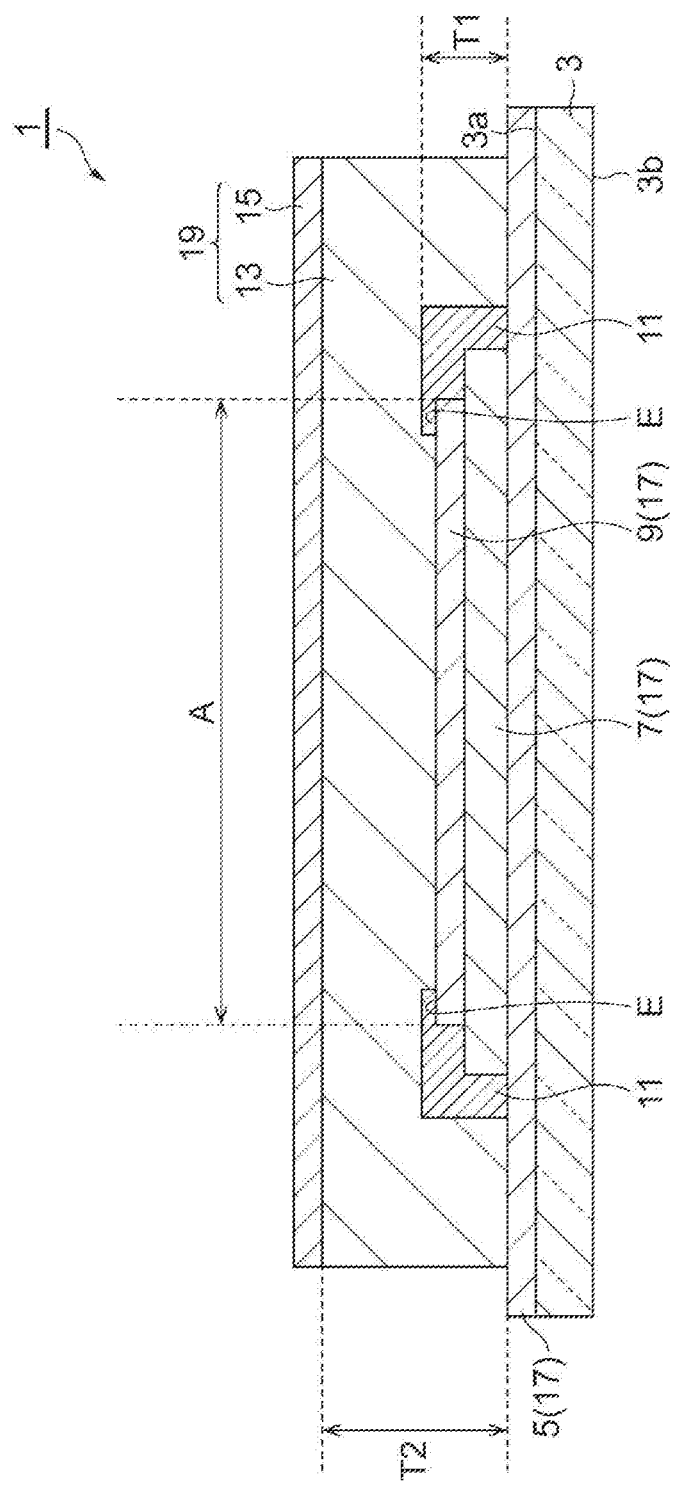
FIG. 2 is a sectional view of the organic EL element taken along line II-II in FIG. 1.

As illustrated in FIGS. 1 and 2, an organic EL element 1 includes a support substrate 3, an anode layer (a first electrode layer) 5, an organic functional layer 7, a cathode layer (a second electrode layer) 9, a moisture absorbing portion 11, an adhesive portion 13, and a sealing base 15. The anode layer 5, the organic functional layer 7, and the cathode layer 9 constitute an organic EL portion 17. The adhesive portion 13 and the sealing base 15 constitute a sealing member 19.

[Support Substrate]

The support substrate 3 is formed of a resin having a light transmitting property with respect to visible light (light with a wavelength of 400 nm to 800 nm). The support substrate 3 has, for example, a rectangular shape. The support substrate 3 is, for example, a film-shaped substrate (a flexible substrate, a substrate having flexibility). The thickness of the support substrate 3 ranges, for example, from 30 μm to 500 μm.

The support substrate 3 is, for example, a plastic film. Examples of the material of the support substrate 3 include polyether sulfone (PES); a polyester resin such as polyethylene terephthalate (PET) or polyethylene naphthalate (PEN); a polyolefin resin such as polyethylene (PE), polypropylene (PP), or cyclic polyolefin; a polyamide resin; a polycarbonate resin; a polystyrene resin; a polyvinyl alcohol resin; a saponified product of an ethylene vinyl acetate copolymer; a polyacrylonitrile resin; an acetal resin; a polyimide resin; and an epoxy resin.

In view of high heat resistance, a low linear expansion coefficient, and a low manufacturing cost, among the above-mentioned resins, a polyester resin and a polyolefin resin can be preferably used as the material of the support substrate 3, and a polyethylene terephthalate and a polyethylene naphthalate can be particularly preferably used. These resins may be used alone or in a combination of two or more types.

A moisture barrier layer (a barrier layer) may be disposed on one principal surface 3a of the support substrate 3. The other principal surface 3b of the support substrate 3 is a light emitting surface. The support substrate 3 may be a glass thin film. The support substrate 3 may be a substrate not having flexibility (for example, a glass substrate).

[Anode Layer]

The anode layer 5 is disposed on one principal surface 3a of the support substrate 3. The anode layer 5 is disposed from one end to the other end in the X direction of the support substrate 3. The anode layer 5 has a predetermined width in the Y direction and has a substantially rectangular shape. An electrode layer having a light transmitting property is used as the anode layer 5. A thin film of metal oxide, metal sulfide, metal, or the like having high electric conductivity can be used as the electrode layer having a light transmitting property, and a thin film having high light transmittance can be preferably used. For example, a thin film formed of indium oxide, zinc oxide, tin oxide, indium tin oxide (abbreviated to ITO), indium zinc oxide (abbreviated to IZO), gold, platinum, silver, copper, or the like is used, and among these, a thin film formed of ITO, IZO, or tin oxide is preferably used.

A transparent conductive film of an organic material such as polyaniline and derivatives thereof or polythiophene and derivatives thereof may be used as the anode layer 5. An electrode in which a metal, a metal alloy, or the like is patterned in a mesh shape or an electrode in which nanowires containing silver are formed in a network shape may be used as the anode layer 5.

The thickness of the anode layer 5 can be determined in consideration of light transmitting properties, electric conductivity, and the like. The thickness of the anode layer 5 generally ranges from 10 nm to 10 μm, preferably ranges from 20 nm to 1 μm, and more preferably ranges from 50 nm to 500 nm.

Examples of the method of forming the anode layer 5 include a vacuum vapor deposition method, a sputtering method, an ion plating method, a plating method, and application coating method.

[Organic Functional Layer]

The organic functional layer 7 is disposed on the anode layer 5 and one principal surface 3a of the support substrate 3. The organic functional layer 7 includes a light emitting layer. The organic functional layer 7 mainly includes an organic material emitting fluorescence and/or phosphorescence or the organic material and a dopant material for a light emitting layer assisting the organic material. For example, the dopant material for a light emitting layer is added to improve emission efficiency or to change an emission wavelength. The organic material may be a low-molecular compound or a high-molecular compound. Examples of a light emitting material constituting the organic functional layer 7 include pigment-based materials, metal complex-based materials, polymer-based materials, or dopant materials for a light emitting layer.

(Pigment-Based Materials)

Examples of the pigment-based materials include cyclopentamine and derivatives thereof, tetraphenyl butadiene and derivatives thereof, triphenyl amine and derivatives thereof, oxadiazole and derivatives thereof, pyrazoloquinoline and derivatives thereof, distyrylbenzene and derivatives thereof, distyrylarylenes and derivatives thereof, pyrrole and derivatives thereof, thiophene compounds, pyridine compounds, perinone and derivatives thereof, perylene and derivatives thereof, oligothiophene and derivatives thereof, oxadiazole dimer and derivatives thereof, pyrazoline dimer and derivatives thereof, quinacridone and derivatives thereof, and coumarin and derivatives thereof.

(Metal Complex-Based Materials)

Examples of the metal complex-based materials include metal complexes having a rare-earth metal such as Tb, Eu, or Dy or Al, Zn, Be, Pt, or Ir as a center metal and having oxadiazole, thiadiazole, phenyl pyridine, phenyl benzimidazole, or a quinolone structure, or the like as a ligand. Examples of the metal complexes include metal complexes emitting light in a triplet excited state such as iridium complex and platinum complex, aluminum quinolinol complex, benzoquinolinol beryllium complex, benzooxazolyl zinc complex, benzothiazole zinc complex, azomethyl zinc complex, porphyrine zinc complex, and phenanthroline europium complex.

(Polymer-Based Materials)

Examples of the polymer-based materials include polyparaphenylene vinylene and derivatives thereof, polythiophene and derivatives thereof, polyparaphenylene and derivatives thereof, polysilane and derivatives thereof, polyacetylene and derivatives thereof, polyfluorene and derivatives thereof, polyvinyl carbazole and derivatives thereof, and materials obtained by polymerizing the pigment-based materials or the metal complex-based materials.

(Dopant Materials for Light Emitting Layer)

Examples of the dopant materials for a light emitting layer include perylene and derivatives thereof, coumarin and derivatives thereof, rubrene and derivatives thereof, quinacridone and derivatives thereof, squarylium and derivatives thereof, porphyrin and derivatives thereof, styryl-based pigments, tetracene and derivatives thereof, pyrazolone and derivatives thereof, decacyclene and derivatives thereof, and phenoxazone and derivatives thereof.

The thickness of the organic functional layer 7 generally ranges from about 2 nm to 200 nm. The organic functional layer 7 is formed, for example, by a coating method using a coating liquid (for example, ink) containing the above-mentioned light emitting materials. A solvent of the coating liquid containing a light emitting material is not particularly limited as long as it can dissolve the light emitting material.

[Cathode Layer]

The cathode layer 9 is formed on the organic functional layer 7 and one principal surface 3a of the support substrate 3. The cathode layer 9 is electrically connected to an extraction electrode 9a. The extraction electrode 9a is disposed on one principal surface 3a of the support substrate 3. The extraction electrode 9a is disposed with a predetermined gap from the anode layer 5. The thickness of the extraction electrode 9a is equal to the thickness of the anode layer 5. The material of the extraction electrode 9a is the same as the material of the anode layer 5. The cathode layer 9 has a predetermined width in the X direction and has a substantially rectangular shape.

For example, an alkali metal, an alkali earth metal, a transition metal, or a metal belonging to Group 13 of the periodic table can be used as the material of the cathode layer 9. Specific examples of the material of the cathode layer 9 include metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, alloys of two or more types of these metals, alloys of one or more types of these metals, and alloys of at least one type of gold, silver, platinum, copper, manganese, titanium, cobalt, nickel, tungsten, and tin, and graphite or graphite intercalation compounds. Examples of the alloys include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

For example, a transparent conductive electrode formed of a conductive metal oxide and a conductive organic material can be used as the cathode layer 9. Specific examples of the conductive metal oxide include indium oxide, zinc oxide, tin oxide, ITO, and IZO, and examples of the conductive organic material include polyaniline and derivatives thereof and polythiophene and derivatives thereof. The cathode layer 9 may be formed as a stacked body in which two or more layers are stacked. An electron injection layer may be used as the cathode layer 9.

The thickness of the cathode layer 9 is set in consideration of electric conductivity and durability. The thickness of the cathode layer 9 generally ranges from 10 nm to 10 μm, preferably ranges from 20 nm to 1 μm, and more preferably ranges from 50 nm to 500 nm.

Examples of the method of forming the cathode layer 9 include a vacuum vapor deposition method, a sputtering method, a laminating method of thermally compressing a metal sheet, and a coating method.

[Moisture Absorbing Portion]

The moisture absorbing portion 11 is a desiccant that captures moisture. The moisture absorbing portion 11 may capture oxygen or the like in addition to moisture. As illustrated in FIG. 1, the moisture absorbing portion 11 is disposed in an outer edge portion E of a light emitting area A of the organic EL portion 17 when viewed in the stacking direction of the organic EL portion 17. As illustrated in FIG. 2, the light emitting area A is an area in which the anode layer 5, the organic functional layer 7, and the cathode layer 9 are continuously superimposed in that order. That is, the light emitting area A is an area in which electron transfer occurs when a voltage is applied to the anode layer 5 and the cathode layer 9. In this embodiment, the light emitting area A has a rectangular shape.

In this embodiment, the moisture absorbing portion 11 has a belt shape when viewed in the stacking direction of the organic EL portion 17 as illustrated in FIG. 1. The moisture absorbing portion 11 is disposed at one end and the other end in the X direction of the light emitting area A, and extends in the Y direction. As illustrated in FIG. 2, the moisture absorbing portion 11 is disposed to cover end faces (exposed faces) of the cathode layer 9 in the outer edge portion E of the light emitting area A (the cathode layer 9), and is disposed in the outer edge portion E of the light emitting area rather than the central portion of the light emitting area A. In other words, the moisture absorbing portion 11 is not disposed in an area other than the outer edge portion E of the light emitting area A. The moisture absorbing portion 11 may be formed up to the anode layer 5 to extend from the outer edge portion away from the central portion of the light emitting area and to cover the ends of the organic functional layer 7 in addition to the outer edge portion E of the light emitting area A. The moisture absorbing portion 11 may be formed up to the support substrate 3 to extend from the outer edge portion E away from the central portion of the light emitting area and to cover the ends of the organic functional layer 7 and the ends of the anode layer 5 in addition to the outer edge portion E of the light emitting area A. The area of the moisture absorbing portion 11 disposed on the light emitting area A is smaller than the total area of the light emitting area A. Specifically, the area of the moisture absorbing portion 11 disposed on the light emitting area A is equal to or less than 20% of the total area of the light emitting area A and is preferably equal to or less than 10% thereof. That is, the outer edge portion E of the light emitting area A is a portion which occupies 20% or less, preferably 10% or less, of the area of the light emitting area A on the side close to the outer edge of the light emitting area A. The thickness T1 of the moisture absorbing portion 11 is smaller than the thickness T2 of the adhesive portion 13. Specifically, the thickness T1 of the moisture absorbing portion 11 is equal to or less than ½ of the thickness T2 of the adhesive portion 13.

The moisture absorbing portion 11 is formed by curing a liquid getter material which is a precursor of the moisture absorbing portion 11. The liquid getter material contains a crosslinking compound (a curable component) having a photoreactive group. The moisture absorbing portion 11 is formed by applying the liquid getter material onto the adhesive portion 13 and then performing an ultraviolet (UV) irradiation process thereon to cure the liquid getter material. The liquid getter material may contain a crosslinking compound having a thermoreactive group. In this case, the liquid getter material is cured by a heating process.

The moisture absorbing portion 11 preferably contains at least one porous material such as an organic metal compound, a metal oxide, or a zeolite as the liquid getter material. A metal of the organic metal compound and the metal oxide preferably contains at least one of aluminum, calcium, and barium. Particularly, an organic aluminum compound or a calcium oxide is more preferable because it has a high rehydration rate of moisture.

The moisture absorbing portion 11 may contain a binder, and may particularly contain at least one of an acrylic resin, an epoxy resin, a styrene resin, an olefin resin, and an amide resin.

The moisture absorbing portion 11 may have a sheet shape. In this case, the moisture absorbing portion 11 is formed by curing a sheet getter material which is a precursor of the moisture absorbing portion 11. The sheet getter material is bonded to the adhesive portion 13. The sheet getter material may be a moisture-absorbing curable material and may be applied to the adhesive portion 13 and then subjected to a heating process or a UV irradiation process to be cured.

It is preferable that a moisture absorption rate of the moisture absorbing portion 11 be equal to or higher than 1 wt % h under an environment of a temperature of 24° C. and humidity of 55% RH.

[Adhesive Portion]

The adhesive portion 13 is used to bond a sealing base 15 to the anode layer 5, the organic functional layer 7, and the cathode layer 9 (the organic EL portion 17). The adhesive portion 13 is disposed to cover the organic EL portion 17.

The adhesive portion 13 is specifically formed of a photo-curable or thermosetting acrylate resin or a photo-curable or thermosetting epoxy resin. A resin film which can be bonded by an impulse sealer which is generally used, for example, a thermo-adhesive film such as an ethylene vinyl acetate copolymer (EVA), a polypropylene (PP) film, a polyethylene (PE) film, or a polybutadiene (PB) film, may be used. A thermoplastic film may also be used.

An adhesive which has high adhesiveness to the organic EL portion 17 and the adhesive portion 13 and good effects for curbing remarkable thermal contraction of the adhesive, separation of the organic EL portion 17 due to a stress to the organic EL portion 17, generation of a component adversely affecting the organic EL portion 17 in the adhesive portion 13, and generation and growth of dark spots with high barrier properties can be preferably used as the adhesive which is used for the adhesive portion 13.

The thickness of the adhesive portion 13 preferably ranges from 1 μm to 100 μm, more preferably ranges from 5 μm to 60 μm, and still more preferably ranges from 10 μm to 30 μm. When the thickness is excessively small, unevenness of the surface of the organic EL portion 17 or dust mixed thereinto cannot be embedded and the unevenness or the mixed dust is likely to apply a mechanical stress to the organic EL material and to cause dark spots. On the other hand, when the thickness is excessively large, the organic EL portion is likely to be affected by moisture which infiltrates from the end face of the adhesive portion 13. When an amount of adhesive applied is excessively large, tunneling, effusion, fine wrinkles, or the like may occur. It is preferable that a moisture content of the adhesive portion 13 be equal to or less than 300 ppm (by weight).

An example of the method of forming the adhesive portion 13 is a hot-melt lamination method. The hot-melt lamination method is a method of melting a hot-melt adhesive and applying an adhesive layer to a base and is a method by which the thickness of the adhesive layer can be generally set in a wide range of 1 μm to 50 μm. An EVA, an ethylene ethyl acrylate copolymer (EEA), a polyethylene, a butyl rubber, or the like is used as a base resin of the adhesive which is generally used for the hot-melt lamination method, a rosin, a xylene resin, a terpene resin, a styrene resin, or the like is added thereto as a tackifier, and wax or the like is added thereto as a plasticizer.

An example of the method of forming the adhesive portion 13 is an extrusion lamination method. The extrusion lamination method is a method of applying a resin which has been molten at a high temperature onto a base using a die and is a method by which the thickness of the adhesive layer can be generally set in a wide range of 10 μm to 50 μm. In general, a low-density polyethylene (LDPE), an EVA, a PP, or the like is used as the resin which is used for the extrusion lamination method.

[Sealing Base]

The sealing base 15 is disposed in an uppermost part (on the adhesive portion 13) in the organic EL element 1. The sealing base 15 is formed of a metal foil, a barrier film in which a barrier functional layer is formed on the front surface, the rear surface, or both surfaces of a transparent plastic film, a film in which a metal having a barrier property is stacked on a glass thin film having flexibility or a plastic film, or the like and has a gas barrier function, particularly, a moisture barrier function. The metal foil is preferably formed of copper, aluminum, or stainless steel in view of a barrier property. It is preferable that the thickness of the metal foil be large in view of suppression of pin holes, and the thickness preferably ranges from 15 μm to 50 μm in consideration of flexibility.

[Method of Manufacturing Organic EL Element]

A method of manufacturing an organic EL element 1 having the above-mentioned configuration will be described below.

Figure 3:
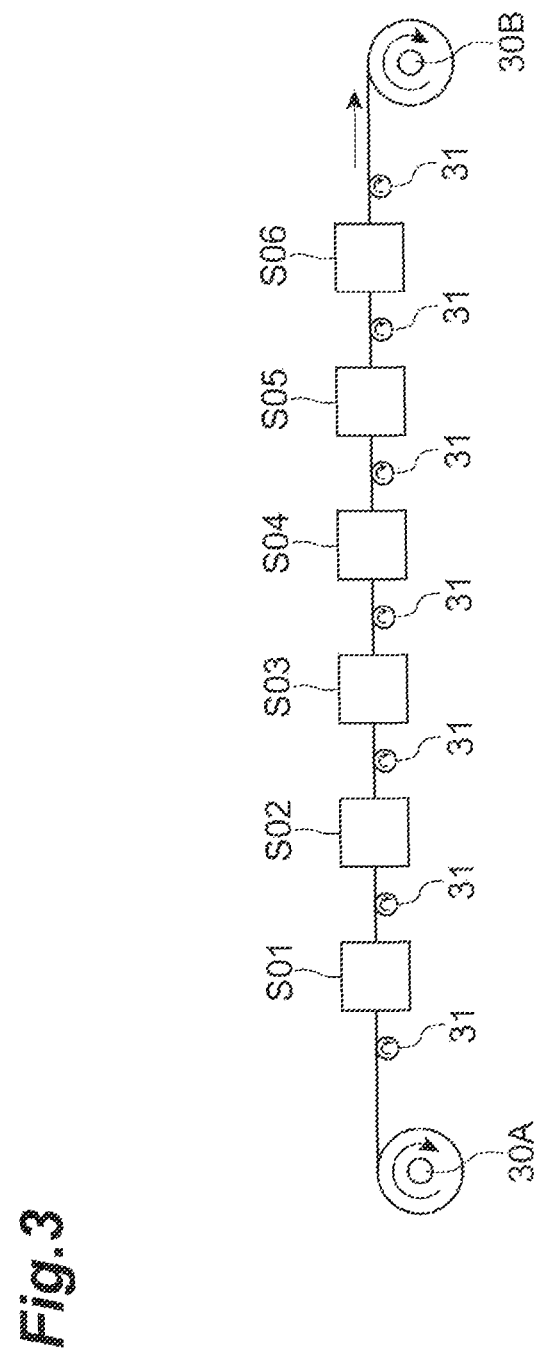
FIG. 3 is a diagram schematically illustrating a method of manufacturing an organic device using a roll-to-roll system.

In the method of manufacturing an organic EL element 1, as conceptually illustrated in FIG. 3, a roll-to-roll process (a continuous conveyance process) is employed. When an organic EL element 1 is manufactured in a roll-to-roll process, a long flexible support substrate 3 suspended between an unwinding roll 30A and a winding roll 30B is continuously conveyed by conveyance rollers 31 and the layers are sequentially formed thereon from the support substrate 3.

When an organic EL element 1 is manufactured, first, the support substrate 3 is heated and dried (substrate drying step S01). Then, an organic EL portion 17 is formed on the dried support substrate 3 (organic EL portion forming step). The organic EL portion 17 is formed by sequentially performing a step of forming an anode layer 5 on the dried support substrate 3 (anode layer forming step S02), a step of forming an organic functional layer 7 on the anode layer 5 (organic functional layer forming step S03), and a step of forming a cathode layer 9 on the organic functional layer 7 (cathode layer forming step S04). When the organic EL portion 17 is formed, the layers can be formed using the formation methods which have been exemplified in description of the layers.

After the organic EL portion 17 is formed, the moisture absorbing portion 11 is formed (moisture absorbing portion forming step S05). The moisture absorbing portion 11 can be formed using the formation method which has been exemplified in description of the moisture absorbing portion 11. After the moisture absorbing portion 11 is formed, a step of bonding a sealing member 19 to the organic EL portion 17 to cover the organic EL portion 17 with the sealing member 19 (sealing step S06) is performed.

As described above, in the organic EL element 1 according to this embodiment, the moisture absorbing portion 11 is disposed in the outer edge portion E of the light emitting area A of the organic EL portion 17. Accordingly, even when bleed-out occurs in the moisture absorbing portion 11, it is possible to prevent a component generated due to the bleed-out from affecting the entire cathode layer 9. Accordingly, in the organic EL element 1, it is possible to minimize generation of dark spots in the cathode layer 9 even when bleed-out occurs. Since the moisture absorbing portion 11 is provided, it is possible to curb reduction of the light emitting area A due to infiltration of moisture. As a result, in the organic EL element 1, it is possible to curb deterioration of emission characteristics.

In this embodiment, the area of the moisture absorbing portion 11 on the light emitting area A is equal to or less than 20% of the area of the light emitting area A and preferably equal to or less than 10% thereof. Accordingly, since about 80% and preferably about 90% of the area of the light emitting area A is secured, it is possible to maintain emission characteristics and to curb deterioration.

In this embodiment, the sealing member 19 includes the adhesive portion 13 that has adhesiveness and that covers the organic EL portion 17 and the moisture absorbing portion 11. The thickness T1 of the moisture absorbing portion 11 is equal to or less than ½ of the thickness T2 of the adhesive portion 13. When the thickness T1 of the moisture absorbing portion 11 is excessively larger than the thickness T2 of the adhesive portion 13, the moisture absorbing portion 11 cannot be appropriately covered with the adhesive portion 13. By setting the thickness T1 of the moisture absorbing portion 11 to be equal to or less than ½ of the thickness 12 of the adhesive portion 13, the moisture absorbing portion 11 can be appropriately covered with the adhesive portion 13.

In the organic EL element 1, in order to prevent absorption of moisture by the moisture absorbing portion 11 from being saturated, it is necessary to secure a predetermined distance between the ends of the sealing member 19 (the right and left ends in FIG. 2) and the moisture absorbing portion 11. In this embodiment, since the moisture absorbing portion 11 is disposed in the outer edge portion E of the light emitting area A, the distance between the ends of the sealing member 19 and the organic EL portion 17 can be reduced in comparison with the configuration in which the moisture absorbing portion 11 is disposed on the support substrate 3 between the organic EL portion 17 and the ends of the sealing member 19. Accordingly, it is possible to reduce a bezel width in the organic EL element 1. As a result, in the organic EL element 1, it is possible to secure the area of the light emitting area A and to achieve a decrease in size.

The invention is not limited to the above-mentioned embodiments and can be modified in various forms. For example, in the embodiment, an organic EL element 1 in which the organic functional layer 7 including a light emitting layer disposed between the anode layer 5 and the cathode layer 9 has been described. However, the configuration of the organic functional layer 7 is not limited thereto. The organic functional layer 7 may have the following configurations.

(a) (anode layer)/light emitting layer/(cathode layer)
(b) (anode layer)/hole injection layer/light emitting layer/(cathode layer)
(c) (anode layer)/hole injection layer/light emitting layer/electron injection layer/(cathode layer)
(d) (anode layer)/hole injection layer/light emitting layer/electron transport layer/electron injection layer/(cathode layer)
(e) (anode layer)/hole injection layer/hole transport layer/light emitting layer/(cathode layer)
(f) (anode layer)/hole injection layer/hole transport layer/light emitting layer/electron injection layer/(cathode layer)
(g) (anode layer)/hole injection layer/hole transport layer/light emitting layer/electron transport layer/electron injection layer/(cathode layer)
(h) (anode layer)/light emitting layer/electron injection layer/(cathode layer)
(i) (anode layer)/light emitting layer/electron transport layer/electron injection layer/(cathode layer)

Here, the symbol "/" means that layers described before and after the symbol "/" are stacked adjacent to each other. The configuration described in (a) is the configuration of the organic EL element 1 according to the above-mentioned embodiments.

Known materials can be used as the materials of a hole injection layer, a hole transport layer, an electron transport layer, and an electron injection layer. The hole injection layer, the hole transport layer, the electron transport layer, and the electron injection layer can be formed, for example, using a coating method similarly to the organic functional layer 7.

The organic EL element 1 may have a single organic functional layer 7 or may have two or more organic functional layers 7. In any one of the layer configurations (a) to (i), when a stacked structure which is disposed between the anode layer 5 and the cathode layer 9 is defined as "Structure unit A," a layer configuration described below in (j) can be exemplified as the configuration of the organic EL element including two organic functional layers 7. The layer configurations of two (Structure units A) may be the same or may be different from each other.

(j) anode layer/(Structure unit A)/charge generation layer/(Structure unit A)/cathode layer Here, a charge generation layer is a layer that generates holes and electrons by application of an electric field thereto. Examples of the charge generation layer include thin films formed of vanadium oxide, ITO, or molybdenum oxide.

When "(Structure unit A)/charge generation layer" is defined as "Structure unit B," a layer configuration described below in (k) can be exemplified as the configuration of the organic EL element including three or more organic functional layers 7.

(k) anode layer/(Structure unit B)$_x$/(Structure unit A)/cathode layer

The symbol "x" denotes an integer which is equal to or greater than 2, and "(Structure unit B)$_x$" denotes a stacked body in which x stages of (Structure units B) are stacked. The layer configurations of (Structure units B) may be the same or may be different from each other.

The organic EL element may be constituted by directly stacking a plurality of organic functional layers 7 instead of forming the charge generating layer.

In the above-mentioned embodiment, in the organic EL element 1, an example in which the other principal surface 3b of the support substrate 3 serves as a light emitting surface has been described. However, the light emitting surface in the organic EL element is not limited to the other principal surface 3b.

In the above-mentioned embodiment, an example in which the first electrode layer is an anode layer 5 and the second electrode layer is a cathode layer 9 has been described. However, the first electrode layer may be a cathode layer and the second electrode layer may be an anode layer.

In the above-mentioned embodiment, an example in which the moisture absorbing portion 11 is disposed on the outer edge portion E of the light emitting area A (the cathode layer 9) to cover the end faces (the exposed surfaces) of the organic functional layer 7 and the cathode layer 9 as illustrated in FIG. 2 has been described. However, the moisture absorbing portion 11 has only to be disposed at least on the outer edge portion E of the light emitting area A. That is, the end faces of the organic functional layer 7 and the cathode layer 9 may not be covered with the moisture absorbing portion 11.

In the above-mentioned embodiment, an example in which the moisture absorbing portion 11 extends continuously in the Y direction as illustrated in FIG. 1 has been described. However, the moisture absorbing portion 11 may be intermittently disposed in the Y direction. That is, a plurality of moisture absorbing portions 11 may be arranged with a predetermined gap in the Y direction.

In the above-mentioned embodiment, an example in which the moisture absorbing portion 11 is disposed at one end and the other end in the X direction of the light emitting area A as illustrated in FIG. 1 has been described. However, the moisture absorbing portion 11 may be disposed in a frame shape to surround the outer edge portion E of the light emitting area A. The moisture absorbing portion 11 may be disposed at any one of one end and the other end in the X direction of the light emitting area A. For example, in a configuration in which a plurality of organic EL portions 17 are arranged on one support substrate 3, the moisture absorbing portion 11 can be disposed in the outer edge portion E of the light emitting area A of the organic EL portion 17 which is located in an outer part of the support substrate 3. The moisture absorbing portion 11 has only to be disposed at a position into which moisture is likely to infiltrate.

In the above-mentioned embodiment, an example in which an organic EL element 1 is manufactured in a roll-to-roll process has been described, but a method of manufacturing an organic EL element 1 is not limited thereto. Various forms can be employed for processes of manufacturing an organic EL element 1.

The structure of an organic EL element is not limited to the structure in the above-mentioned embodiment, but can be embodied in various forms.

EXAMPLES

Example

A glass substrate with a thickness of 0.7 mm was prepared as a support substrate. An ITO thin film with a thickness of 45 nm was formed on one principal surface of the support substrate and then an anode layer and an extraction electrode were formed to be disposed from one end to the other end in the X direction of the support substrate and to have a width of 10 mm in the Y direction using a photolithography method as illustrated in FIG. 1.

The glass substrate on which the anode layer and the extraction electrode were formed was put into a cleaning vessel and was ultrasonically cleaned while being sequentially immersed in Semicoclean (made by Furuuchi Chemical Co.), ultra-pure water, and isopropyl alcohol. Thereafter, the resultant was subjected to UV ozone treatment for 15 minutes.

Subsequently, a hole injection layer, a hole transport layer, a light emitting layer, and an electron transport layer were stacked thereon using a spin coating method to form an organic functional layer. Thereafter, sodium fluoride and aluminum were sequentially stacked to form a cathode layer. The cathode layer was formed to be electrically connected to the extraction electrode as illustrated in FIG. 1 and to have a width of 10 mm in the X direction by a vacuum vapor deposition method using a metal mask. Accordingly, an organic EL portion having a light emitting area of 10 square mm was formed.

Subsequently, the resultant was input to a glove box which was replaced with nitrogen gas without exposing it to air and a liquid getter material containing a thermo-cross-linking compound filled in a syringe was applied onto a light emitting area with a dispenser. At this time, the liquid getter material was applied in a belt shape to only outer edge portions of one end and the other end in the X direction of the light emitting area in order to cover end faces from which the cathode layer was exposed. Thereafter, a moisture absorbing portion was formed by heating the resultant on a hot plate to cure the liquid getter material. At this time, the moisture absorbing portion overlapped the outer edge portion by 0.5 mm, and the area of the moisture absorbing portion disposed on the light emitting area was 10% of the area of the light emitting area.

Thereafter, a sealing member in which an adhesive sheet with a thickness of 30 μm was bonded to an electrolytic copper foil substrate (made by Fukuda Metal Foil & Powder Co., Ltd.) with a thickness of 35 μm was heated using a hot plate in a glove box, was cooled at room temperature, and then was bonded to the support substrate on which the organic EL portion was formed using a hand roller to seal the support substrate.

Comparative Example 1

The same processes as in the above-mentioned example were performed until an organic EL portion was formed, and a moisture absorbing portion was formed by applying a liquid getter material to the entire surface of the light emitting area including the end face of the cathode layer using a dispenser and then heating the resultant on a hot plate to cure the liquid getter material. At this time, since the moisture absorbing portion was formed on the entire surface of the light emitting area, the area of the moisture absorbing portion disposed in the light emitting area was 100% of the area of the light emitting area. Thereafter, a sealing member was bonded thereto to seal the resultant.

Comparative Example 2

The same processes as in the above-mentioned example were performed until an organic EL portion was formed, and a sealing member was bonded to the resultant to seal it without applying a liquid getter material or forming a moisture absorbing portion.

(Evaluation)

The sealed organic EL element 1 was taken out of the glove box into the air and was driven with a current density of 10 mA/cm$^2$. After it was ascertained that the entire surface of the light emitting area of 10 square mm emitted light without any dark spots (non-light-emitting portions), the organic EL element was stored in a storage environment of a temperature of 85° C. and humidity of 90% for 600 hours and was driven again with a current density of 10 mA/cm², and an emission state thereof was observed. A light emitting area survival rate was calculated using the following method.

(Calculation of Light Emitting Area Survival Rate)

An organic EL element is driven with a current density of 10 mA/cm², and an emission area is measured (initial emission area ($A_0$)). Then, the organic EL element is stored in a storage environment of a temperature of 85° C. and humidity of 90% for 600 hours and is driven again with a current density of 10 mA/cm², and an emission state is observed to measure an emission area ($A_{600}$) after storage.

The light emitting area survival rate is calculated by the following equation.

Light emitting area survival rate=$A_{600}/A_0 \times 100$(%)

The emission area can be calculated by imaging emission of light using a camera during EL driving, extracting emission places by binarizing the image, and summing areas of the emission places.

(Result)

In the example, in only an area overlapped by the moisture absorbing portion, dark spots were sporadically generated and deterioration occurred, but the deteriorated area was limited to 0.5 mm at both ends of the light emitting area of 10 square mm. In the other areas, there were no dark spots, normal emission of light was maintained, and the normal light emitting area was kept at 95%. That is, the light emitting area survival rate was 95%. On the other hand, in Comparative Example 1, deterioration of the light emitting area in the end faces from which the cathode layer was exposed was not ascertained, but dark spots were generated in the entire surface of the light emitting area and only 80% of the light emitting area survived. In Comparative Example 2, deterioration of the light emitting area in the end faces from which the cathode layer was exposed was remarkable, non-light-emitting areas within 2 mm from both ends were ascertained, and 60% of the light emitting area survived.

In the organic EL element, the light emitting area survival rate which is measured under the above-mentioned conditions is preferably greater than 80%, more preferably equal to or greater than 85%, and still more preferably equal to or greater than 90%.

REFERENCE SIGNS LIST

1 Organic EL element
3 Support substrate
5 Anode layer (first electrode layer)
7 Organic functional layer
9 Cathode layer (second electrode layer)
11 Moisture absorbing portion
13 Adhesive portion
17 Organic EL portion
19 Sealing member
A Light emitting area
E Outer edge portion

The invention claimed is:

1. An organic EL element comprising:
   a support substrate;
   an organic EL portion that is disposed on the support substrate and is formed by stacking a first electrode layer, an organic functional layer, and a second electrode layer;
   a sealing member that seals the organic EL portion; and
   one or more moisture absorbing portions that have moisture absorption characteristics,
   wherein the one or more moisture absorbing portion is disposed in an outer edge portion of a light emitting area of the organic EL portion in which the first electrode layer, the organic functional layer, and the second electrode layer are sequentially continuously superimposed when viewed in a stacking direction of the organic EL portion, and
   wherein entire area of the one or more moisture absorbing portion disposed on the light emitting area when viewing at a top-view plane of the support substrate is smaller than entire area of the light emitting area when viewing at a top-view plane of the support substrate,
   wherein the one or more moisture absorbing portion and at least a part of the upper surface of the second electrode layer are in contact each other.

2. The organic EL element according to claim 1, wherein the area of the one or more moisture absorbing portion disposed on the light emitting area occupies 20% or less of the area of the light emitting area.

3. The organic EL element according to claim 1, wherein the area of the one or more moisture absorbing portion disposed on the light emitting area occupies 10% or less of the area of the light emitting area.

4. The organic EL element according to claim 1, wherein the one or more moisture absorbing portion is disposed to cover an end face of the second electrode layer.

5. The organic EL element according to claim 1, wherein the one or more moisture absorbing portion is disposed to cover end faces of the organic functional layer and the second electrode layer.

6. The organic EL element according to claim 1,
   wherein the first electrode layer is an anode, and
   wherein the second electrode layer is a cathode.

7. The organic EL element according to claim 1,
   wherein the sealing member includes an adhesive portion that has adhesiveness and covers the organic EL portion and the one or more moisture absorbing portion, and
   wherein a thickness of the one or more moisture absorbing portion is equal to or less than ½ of a thickness of the adhesive portion.

* * * * *